United States Patent [19]

Taka et al.

[11] Patent Number: 5,426,374
[45] Date of Patent: Jun. 20, 1995

[54] PIEZOELECTRIC BODY POLARIZING APPARATUS

[75] Inventors: Hideto Taka; Yoshikatsu Maeda, both of Nagaokakyo, Japan

[73] Assignee: Murata Manufacturing Co., Ltd., Kyoto, Japan

[21] Appl. No.: 190,665

[22] Filed: Feb. 2, 1994

[30] Foreign Application Priority Data

Feb. 5, 1993 [JP] Japan .................................. 5-018406

[51] Int. Cl.⁶ ............................................. G01R 27/02
[52] U.S. Cl. .................................. 324/727; 324/652; 361/225
[58] Field of Search ............... 324/603, 652, 727, 109; 361/225; 356/30

[56] References Cited

U.S. PATENT DOCUMENTS 4,447,782  5/1984  Rutkoski ........................ 324/727
5,146,174  9/1992  Toliver et al. .................. 324/727

FOREIGN PATENT DOCUMENTS 296225    2/1971   U.S.S.R. .
1522126   11/1989  U.S.S.R. .

*Primary Examiner*—Kenneth A. Wieder
*Assistant Examiner*—Glenn W. Brown
*Attorney, Agent, or Firm*—Ostrolenk, Faber, Gerb & Soffen

[57] ABSTRACT

A piezoelectric body polarizing apparatus including a DC power supply 2 for applying a DC voltage to a piezoelectric body 1 to polarize the piezoelectric body 1, an impedance measuring circuit 4 for measuring the change in impedance of the piezoelectric body 1, a high frequency power supply 5, and a DC current blocking filter 3 connected between a high frequency portion, which is constituted by the impedance measuring circuit 4 and the high frequency power supply 5, and the piezoelectric body 1. The DC current blocking filter 3 includes at least a DC current blocking capacitor $C_1$ and a transient current bypass capacitor $C_2$ connected between a node A, between the DC current blocking capacitor $C_1$ and the high frequency portion, and a ground potential.

13 Claims, 3 Drawing Sheets

PIEZOELECTRIC BODY POLARIZING APPARATUS

BACKGROUND OF THE INVENTION

1. Field of the Invention

The present invention relates generally to an apparatus for polarizing a piezoelectric body such as piezoelectric ceramics, and more particularly, to a piezoelectric body polarizing apparatus capable of polarizing a piezoelectric body while measuring the degree of polarization thereof.

2. Description of the Prior Art

In manufacturing a piezoelectric component such as a piezoelectric resonator or a piezoelectric filter, a piezoelectric body such as piezoelectric ceramics must be polarized. Piezoelectric ceramics have been conventionally polarized by the following processes.

First, electrodes for polarization are formed on both surfaces of a piezoelectric body, and a DC voltage of, for example, several kilovolts is applied to the piezoelectric body to polarize the piezoelectric body. A high frequency voltage is then applied to the piezoelectric body, to measure impedance-frequency characteristics, for example. The degree of polarization is evaluated from the frequency difference between a resonance point and an antiresonance point, for example, to confirm whether or not a desired degree of polarization is attained. If the measured degree of polarization is not the desired degree of polarization, a DC voltage is applied again to adjust the degree of polarization. For example, if the attained degree of polarization is lower than the desired degree of polarization, the DC voltage is applied to the piezoelectric body in the same direction as the DC voltage applied in the first process of polarization to increase the degree of polarization. On the other hand, if the attained degree of polarization is higher than the desired degree of polarization, the DC voltage is applied to the piezoelectric body in the opposite direction to the DC voltage applied in the first process of polarization to decrease the degree of polarization. Thereafter, the impedance-frequency characteristics, for example, of the piezoelectric body are measured again, thereby to confirm whether or not the degree of polarization attains the desired degree of polarization. The above described processes of measuring the degree of polarization and controlling the degree of polarization are repeated, thereby to obtain a piezoelectric body having the desired degree of polarization.

In the piezoelectric body, the attained degree of polarization is found to significantly vary even if the same DC voltage is applied, due to the variation between the manufacturing lots. In the conventional method of polarization, therefore, the processes of polarization and controlling polarization and the process of measuring the degree of polarization must be repeated a significant number of times, resulting in very complicated work.

If the process of polarization and the process of measuring the degree of polarization were to be simultaneously carried out, it is considered that a piezoelectric body having the desired degree of polarization could be easily obtained without passing through the above described complicated processes. However, a very high DC voltage of several kilovolts is applied in the case of polarization. If a high frequency circuit for measuring the degree of polarization were connected to the piezoelectric body, therefore, it is considered that the effect of the high DC voltage on the high frequency circuit could not be avoided. Consequently, no attempt to apply a DC voltable for polarization to the piezoelectric body and to measure the degree of polarization of the piezoelectric body at the same time has been conventionally made.

SUMMARY OF THE INVENTION

An object of the present invention is to provide a piezoelectric body polarizing apparatus capable of polarizing the piezoelectric body by applying; a DC voltage and measuring the degree of polarization of the piezoelectric body at the same time and consequently, obtaining a piezoelectric body having a desired degree of polarization without repeating complicated processes.

According to the present invention, there is provided a piezoelectric body polarizing apparatus comprising DC voltage applying means for applying a DC voltage to a piezoelectric body so as to polarize the piezoelectric body, a high frequency power supply for applying a high frequency voltage to the piezoelectric body so as to measure the degree of polarization of the piezoelectric body, impedance measuring means for measuring the change in impedance of the piezoelectric body to which the high frequency voltage is applied to evaluate the degree of polarization, a DC current blocking capacitor connected between a high frequency portion which is constituted by the high frequency power supply and the impedance measuring means and the piezoelectric body, and DC current blocking filter means having at least a transient current bypass capacitor connected between a node between the DC current blocking capacitor and the high frequency portion and a ground potential.

In the polarizing apparatus according to the present invention, the DC voltage is applied to the piezoelectric body by the DC voltage applying means to polarize the piezoelectric body. Further, the high frequency power supply and the impedance measuring means are connected to the piezoelectric body, thereby to make it possible to evaluate the degree of polarization from the change in impedance simultaneously with the polarization.

Moreover, the above described DC current blocking capacitor is connected between the high frequency portion which is constituted by the high frequency power supply and the impedance measuring means and the piezoelectric body, so that the leakage of a DC current used for polarization to the high frequency portion is cut. Further, a transient current flowing when the DC voltage applying means is turned on is caused to flow to the ground potential through the transient current bypass capacitor, thereby to make it possible to prevent the effect of the DC current used for polarization on the high frequency portion.

According to the present invention, the impedance of the piezoelectric body can be measured in real time in the impedance measuring means when the DC voltage is applied to polarize the piezoelectric body, thereby to make it possible to evaluate the degree of polarization of the piezoelectric body based on impedance-frequency characteristics in real time. Consequently, it is possible to evaluate and compare characteristics of a piezoelectric material such as its susceptibility to polarization very easily.

Although in the conventional example, the process of applying a DC voltage and the process of checking the degree of polarization must be frequently repeated, the degree of polarization can be measured in real time simultaneously with polarization in the present invention, thereby to make it possible to obtain a piezoelectric body having a desired degree of polarization immediately by simply stopping the application of a DC voltage for polarization. Accordingly, it is possible to obtain a piezoelectric body having a desired degree of polarization reliably and easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described to clarify the present invention.

Figure 1:
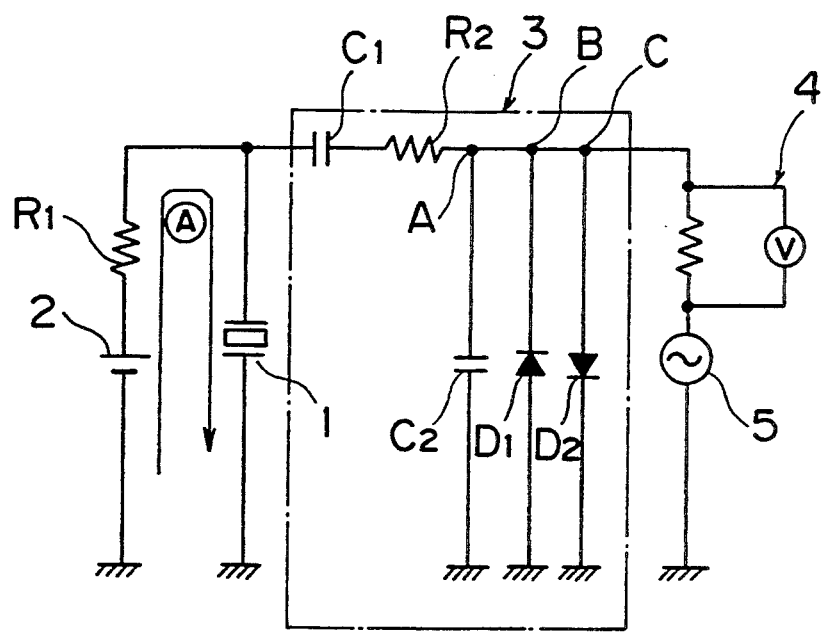
FIG. 1 is a circuit diagram for explaining a polarizing apparatus according to a first embodiment of the present invention.

FIG. 1 is a circuit diagram for explaining a polarizing apparatus according to one embodiment of the present invention. In the polarizing apparatus according to the present embodiment, the degree of polarization of a piezoelectric body 1 is measured in real time at the same time that the piezoelectric body 1 is polarized.

DC voltage applying means, constructed by connecting a resistor $R_1$ and a DC power supply 2 in series, is connected to the piezoelectric body 1. The resistor $R_1$ is connected in series with the DC power supply 2 so as to serve as a protective resistor for preventing a short-circuit overcurrent. The piezoelectric body 1 is polarized by a DC current flowing in a direction indicated by an arrow A from the DC voltage applying means. A DC voltage in the case of polarization is generally a very high voltage of several kilovolts.

Figure 2:
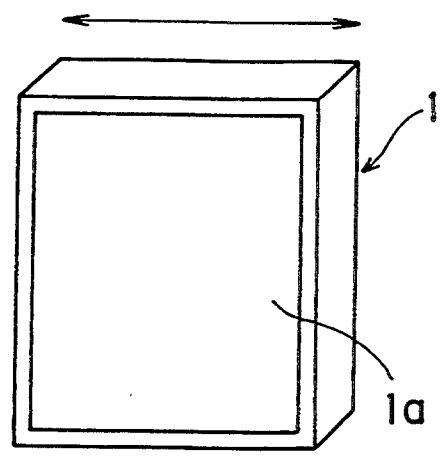
FIG. 2 is a perspective view showing a piezoelectric body.

On the other hand, an impedance measuring circuit 4 and a high frequency power supply 5 are connected to the piezoelectric body 1 through DC current blocking filter means 3. A high frequency voltage is applied to the piezoelectric body 1 by the high frequency power supply 5, to measure the change in impedance of the piezoelectric body 1 by the impedance measuring circuit 4. If the piezoelectric body 1 shown in FIG. 2, for example, is taken as an example, impedance characteristics of short side vibration (vibration in a direction indicated by an arrow) can be measured by the impedance measuring circuit 4, to obtain impedance-frequency characteristics shown in FIG. 3. In FIG. 2, 1a denotes an electrode for polarization. Electrodes for polarization are formed on both major surfaces of the piezoelectric body 1.

The DC current blocking filter means 3 is connected as described above between a high frequency portion, which is constituted by the high frequency power supply 5 and the impedance measuring circuit 4, and the piezoelectric body 1. The DC current blocking filter means 3 has a structure in which a DC current blocking capacitor $C_1$ and a voltage dropping resistor $R_2$ are connected between the piezoelectric body 1 and the impedance measuring circuit 4. In addition, a transient current bypass capacitor $C_2$ is connected between a node A between the resistor $R_2$ and the impedance measuring circuit 4 and a ground potential. Further, a diode $D_1$ and a diode $D_2$ are respectively connected between nodes B and C, between the resistor $R_2$ and the impedance measuring circuit 4, and the ground potential. The diode $D_1$ is so connected that the cathode is on the side of the node B and is so provided that a discharge current of the capacitor $C_1$ is bypassed to the ground potential. On the other hand, the diode $D_2$ is provided so as to bypass a transient current flowing from the DC voltage applying means.

Figure 3:
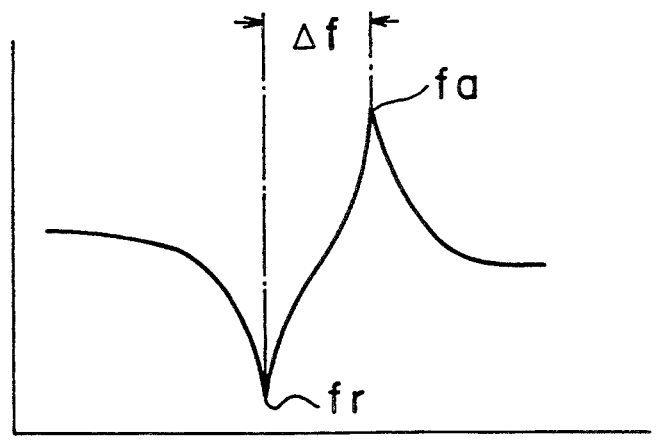
FIG. 3 is a diagram showing impedance-frequency characteristics of a piezoelectric body.

In the polarizing apparatus according to the present embodiment, the DC voltage applied from the DC voltage applying means is applied to the piezoelectric body 1, to polarize the piezoelectric body 1. In this case, the flow of the DC current is in the direction indicated by the arrow A as shown. The high frequency voltage is applied to the piezoelectric body 1 by the high frequency power supply 5 simultaneously with the polarization, to measure the impedance-frequency characteristics of the piezoelectric body 1 by the impedance measuring circuit 4. If the piezoelectric body 1 shown in FIG. 2 is taken as an example, the impedance-frequency characteristics of the short side vibration (the vibration in the direction indicated by the arrow as shown) are obtained as shown in FIG. 3. In FIG. 3, the difference in frequency $\Delta f$ between a resonance point $f_r$ and an antiresonance point $f_a$ on an impedance-frequency characteristics curve has collation in the degree of polarization. Consequently, it can be determined whether or not a desired degree of polarization is attained by viewing a waveform of the impedance-frequency characteristics. If the DC power supply 2 is turned off in the stage in which a desired degree of polarization is attained, therefore, it is possible to reliably obtain a piezoelectric body having a desired degree of polarization.

As described in the foregoing, a DC voltage used for polarization is a very high voltage of several kilovolts. If a high frequency voltage were applied to measure the degree of polarization as in the present embodiment, therefore, it has been conventionally considered to be unavoidable that the DC current leaking from the DC voltage applying means would effect the high frequency portion. On the other hand, in the present embodiment, the effect of the DC current on the high frequency portion is reliably prevented by the DC current blocking filter means 3.

More specifically, a transient current flows through the capacitor $C_1$ immediately after the DC power supply 2 is turned on. This transient current is caused to flow to the ground potential by the transient current bypass capacitor $C_2$ as well as the diode $D_2$ serving as means for bypassing transient current. Consequently, the effect of the transient current on the high frequency portion can be reliably prevented.

On the other hand, if the piezoelectric body 1 is short-circuited, a DC current by which the capacitor $C_1$ is charged flows as a current in the opposite direction. This current is caused to flow to the ground potential by the diode $D_1$ serving as means for bypassing capacitor discharge current. Accordingly, the effect on the high frequency portion can be similarly prevented.

The impedance of the diodes $D_1$ and $D_2$ is high to the high frequency current, since the voltage of the high frequency power supply 5 is in the forward non-operating voltage range, that is, small. In addition, a constant at which low impedance is achieved to the high frequency current is selected with respect to the capacitor $C_1$, thereby to make it possible to reduce the effect on the high frequency portion. Further, a constant at which high impedance is achieved must be selected with respect to the transient current bypass capacitor $C_2$, since the magnitude of the transient current is relatively large. In any case, the constants of the diodes $D_1$ and $D_2$ and the capacitors $C_1$ and $C_2$ are suitably selected depending on the type of piezoelectric body, the degree of polarization, a DC voltage required for polarization, and the like.

Figure 4:
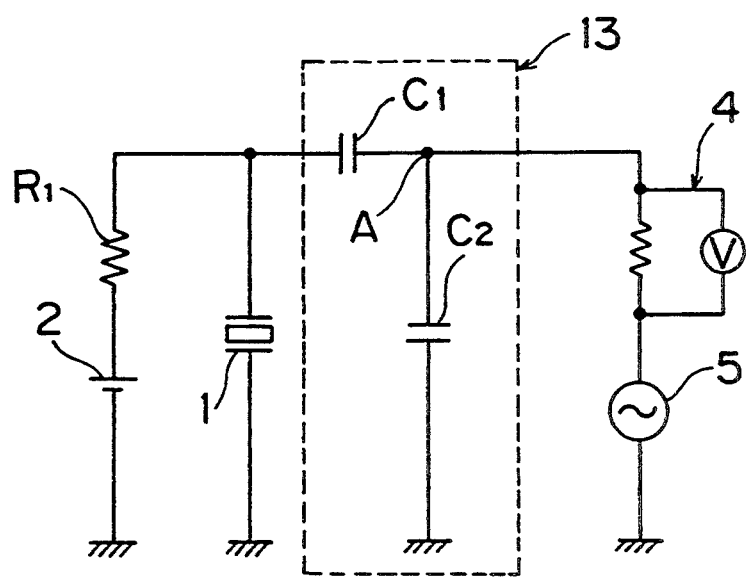
FIG. 4 is a circuit diagram for explaining a polarizing apparatus according to a second embodiment.
Figure 5A:
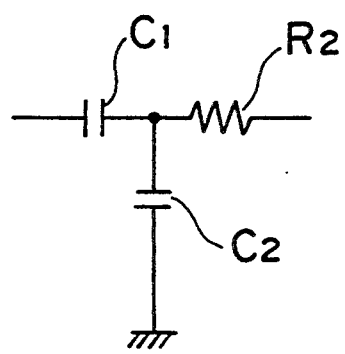
FIGS. 5A and 5B are circuit diagrams showing modified examples of DC current blocking filter means.
Figure 5B:
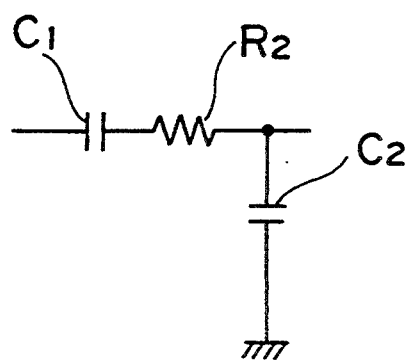

In the embodiment shown in FIG. 1, the DC current blocking filter means 3 is constructed by connecting the above described respective elements. However, the present invention can be also constructed by circuits different from that shown in FIG. 1. In such circuits, the DC current and the transient current required for polarization flowing from the DC voltage applying means can be prevented from affecting the high frequency portion. FIGS. 4 and 5A and 5B are circuit diagrams for explaining other examples of DC current blocking filter means.

Referring to FIG. 4, a polarizing apparatus according to a second embodiment is the same as that in the first embodiment except that DC current blocking filter means 13 is constituted by only a DC current blocking capacitor $C_1$ and a transient current bypass capacitor $C_2$ and hence, the description thereof is omitted by assigning corresponding reference numerals.

In the polarizing apparatus according to the second embodiment, a piezoelectric body 1 is polarized by a DC voltage applied by DC voltage applying means as in the first embodiment, and the degree of polarization thereof is evaluated in real time on the basis of impedance characteristics obtained by an impedance measuring circuit 4. Moreover, a large transient current flowing when a DC power supply 2 is turned on is caused to flow to a ground potential by the transient current bypass capacitor $C_2$. In addition, a normal DC current is cut by the DC current preventing capacitor $C_1$. Consequently, the degree of polarization can be measured in real time while preventing the effect of the DC current on a high frequency portion.

FIG. 5A shows another example of DC current blocking filter means. In this case, in addition to a DC current blocking capacitor $C_1$ and a transient current bypass capacitor $C_2$, a voltage dropping resistor $R_2$ used in the first embodiment is connected in series with the capacitor $C_1$. Consequently, a DC current which cannot be completely removed by the capacitor $C_1$ is further reduced in the resistor $R_2$.

FIG. 5B shows a modified example of the DC current blocking filter means shown in FIG. 5A. In this case, a voltage lowering resistor $R_2$ is connected between one end of a capacitor $C_1$ and a node A to which a transient current bypass capacitor $C_2$ is connected. When a transient current flows, therefore, the voltage of the transient current can be lowered by the voltage dropping resistor $R_2$, thereby to make it possible to reliably prevent the effect of the transient current on a high frequency portion more reliably than the DC current blocking filter means shown in FIG. 5A.

As apparent from the DC current blocking filter means in the above described respective embodiments and modified examples, if the DC current blocking filter means comprises at least a DC current blocking capacitor $C_1$ connected between a piezoelectric body and a high frequency portion and a transient current bypass capacitor $C_2$ connected between a node A, between the DC current blocking capacitor $C_1$ and the high frequency portion, and a ground potential, the effect of a DC current on the high frequency portion can be reliably prevented. Therefore, it is found that the degree of polarization can be measured in the high frequency portion in real time and with high precision.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric body polarizing apparatus, comprising:

DC voltage applying means for applying a DC voltage to a piezoelectric body so as to polarize the piezoelectric body;

a high frequency power supply for applying a high frequency voltage to said piezoelectric body so as to measure the degree of polarization of the piezoelectric body;

impedance measuring means for measuring the change in impedance of the piezoelectric body to which said high frequency voltage is applied to evaluate the degree of polarization of the piezoelectric body; and DC current blocking filter means comprising at least (1) a DC current blocking capacitor connected between a high frequency portion, which is constituted by said high frequency power supply and said impedance measuring means, and (2) said piezoelectric body and a transient current bypass capacitor connected between a node, between said DC current blocking capacitor and the high frequency portion, and a reference potential.

2. The piezoelectric body polarizing apparatus according to claim 1, wherein
said DC voltage applying means comprises a DC power supply and a resistor connected in series with said DC power supply.

3. The piezoelectric body polarizing apparatus according to claim 1, wherein
said DC current blocking filter means further comprises a resistor connected in series with said DC current blocking capacitor.

4. The piezoelectric body polarizing apparatus according to claim 3, wherein
said resistor is connected to a stage succeeding the node to which said transient current bypass capacitor is connected.

5. The piezoelectric body polarizing apparatus according to claim 3, wherein
said resistor is connected to a stage preceding said node to which said transient current bypass capacitor is connected.

6. The piezoelectric body polarizing apparatus according to claim 1, wherein
said DC current blocking filter means further comprises rectifying means for bypassing capacitor discharge current connected between the node, between said DC current blocking capacitor and said impedance measuring means, and the reference potential and for preventing the reverse flow of a DC current by which the DC current blocking capacitor is charged.

7. The piezoelectric body polarizing apparatus according to claim 6, wherein
said rectifying means for bypassing capacitor discharge current is a diode so connected that the cathode is on the side of said node.

8. The piezoelectric body polarizing apparatus according to claim 7, wherein
a resistor is connected between the node to which said transient current bypass capacitor is connected and said DC current blocking capacitor.

9. The piezoelectric body polarizing apparatus according to claim 6, wherein
a resistor is connected between the node to which said transient current bypass capacitor is connected and said DC current blocking capacitor.

10. The piezoelectric body polarizing apparatus according to claim 1, further comprising
rectifying means for bypassing transient current connected between a node between said DC currant blocking capacitor and said impedance measuring means and the reference potential and for bypassing a transient current flowing from said DC voltage applying means.

11. The piezoelectric body polarizing apparatus according to claim 10, wherein
said rectifying means is a diode in which the cathode is connected to the reference potential.

12. The piezoelectric body polarizing apparatus according to claim 11, wherein
a resistor is connected between the node to which said transient current bypass capacitor is connected and said DC current blocking capacitor.

13. The piezoelectric body polarizing apparatus according to claim 10, wherein
a resistor is connected between the node to which said transient current bypass capacitor is connected and said DC current blocking capacitor.

* * * * *